United States Patent [19]
Nishikawa et al.

[11] Patent Number: 6,119,592
[45] Date of Patent: Sep. 19, 2000

[54] APPARATUS FOR SCREEN PRINTING HAVING A BELT SCREEN AND LOCKING FRAME

[75] Inventors: Noboru Nishikawa, Yamanashi; Hiroki Yamamoto, Kofu; Takeshi Kuribayashi, Nakakoma-gun, all of Japan

[73] Assignee: Matsushita Electric Industrial Co., Ltd., Osaka, Japan

[21] Appl. No.: 09/240,485

[22] Filed: Jan. 29, 1999

Related U.S. Application Data

[63] Continuation-in-part of application No. 08/886,344, Jul. 1, 1997, abandoned.

[30] Foreign Application Priority Data

Jul. 3, 1996 [JP] Japan ........................... 8-173693

[51] Int. Cl.[7] ........................... B41L 13/08; B41L 39/02; B05C 17/08
[52] U.S. Cl. .................. 101/121; 101/127.1; 101/484
[58] Field of Search ................ 101/128.4, 122, 101/121, 129, 50, 128.21, 127, 127.1, 484

[56] References Cited

U.S. PATENT DOCUMENTS

| | | | |
|---|---|---|---|
| 2,549,847 | 4/1951 | Oldofredi | 101/32 |
| 2,884,853 | 5/1959 | Cantoni | 101/112 |
| 4,060,030 | 11/1977 | Noschese | 101/127.1 |
| 4,497,848 | 2/1985 | Baran | 101/128.4 |
| 4,771,687 | 9/1988 | Daunheimer | 101/129 |
| 5,165,336 | 11/1992 | Spencer | 101/35 |
| 5,334,815 | 8/1994 | MacNaughton et al. | 219/121.7 |
| 5,450,789 | 9/1995 | Hasegawa | 101/129 |

FOREIGN PATENT DOCUMENTS

| | | | |
|---|---|---|---|
| 029348 | of 0000 | European Pat. Off. | 101/128.4 |
| 6027033 | of 0000 | Japan . | |

OTHER PUBLICATIONS

"Fixture for Accurate Artwork Registration," by J.S. Crimi et al., IBM Technical Disclosure Bulletin, vol. 21, No. 8, Jan. 1979.

*Primary Examiner*—John S. Hilten
*Assistant Examiner*—Leslie J. Grohusky
*Attorney, Agent, or Firm*—Price, Gess & Ubell

[57] ABSTRACT

A belt-like screen carrying a row of printing patterns is held between two roller screen holders. The printing patterns are advanced one by one to a printing position by the rotation of the roller screen holders. This allows the printing patterns to be changed from one to another. Frames are provided for locking and unlocking the printing patterns at the printing position. The completion of a run of printed circuit boards can be monitored to automatically change the printing patterns.

19 Claims, 10 Drawing Sheets

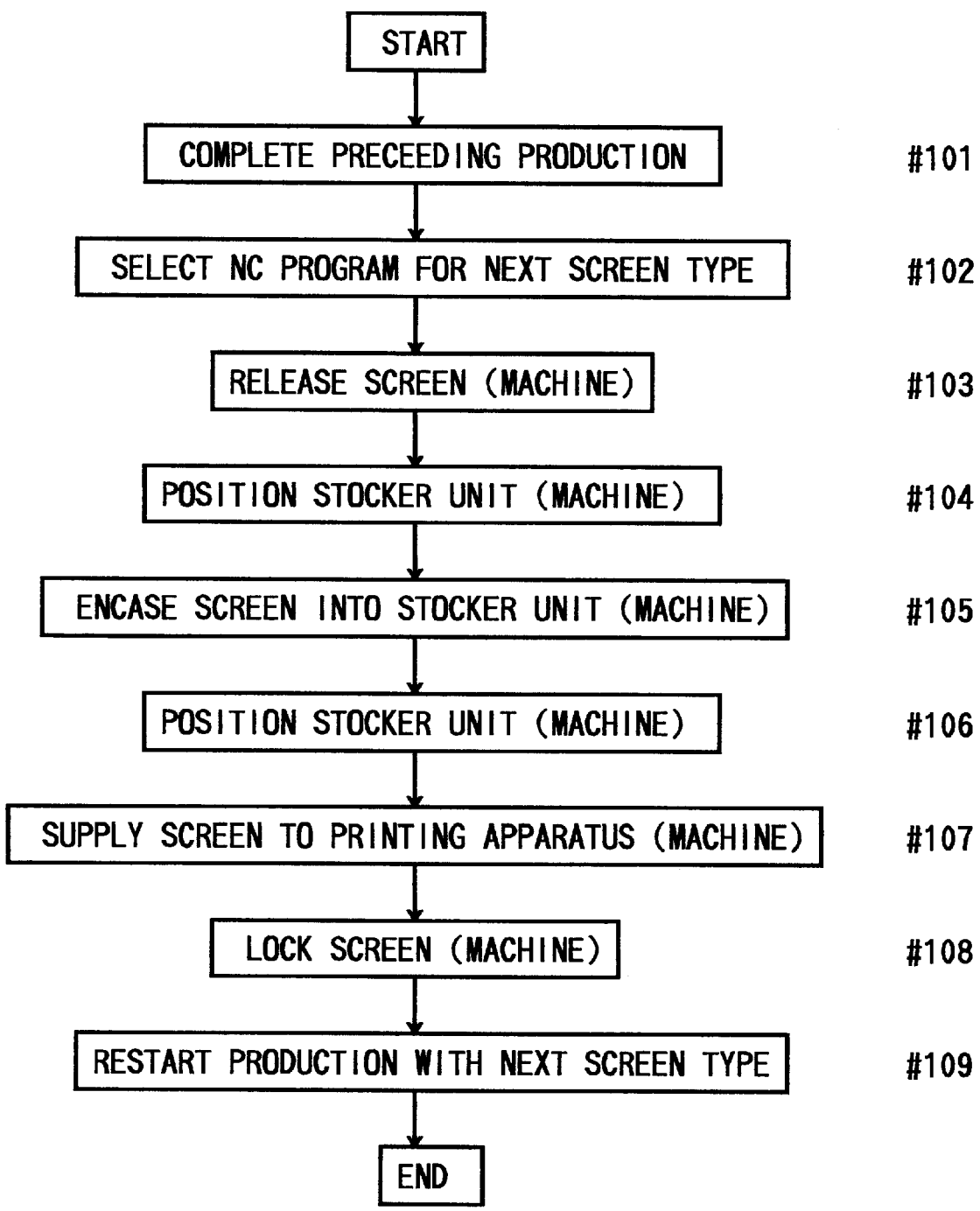

APPARATUS FOR SCREEN PRINTING HAVING A BELT SCREEN AND LOCKING FRAME

RELATED APPLICATIONS

This application is a continuation-in-part application of U.S. Ser. No. 08/886,344 filed on Jul. 1, 1997, now abandoned.

BACKGROUND OF THE INVENTION

1. Field of the Invention

The present invention relates generally to a screen printing method and apparatus to be used in an electronic components mounting process, and particularly to a screen printing method and apparatus of high efficiency in exchanging screens in an automatic manner to increase the productivity and speed of production.

2. Description of Related Art

FIGS. 9–12 show a method of replacing a screen with another in a conventional screen printing apparatus.

FIG. 9 illustrates parts of a screen printing apparatus for exchanging screens and a configuration of a screen exchanger. The numerals 21 and 22 represent the printing apparatus and the automatic screen exchanger, respectively. A screen 23 is fixed in place and released therefrom by a screen locking/unlocking device 25 in the printing apparatus 21. The screen 23 has a printing pattern 23b in which a plurality of screen apertures 23a are formed as shown in FIG. 10. Around the screen 23 is a screen frame 24, which is provided for locking and unlocking the screen 23 by the screen locking/unlocking device 25.

The automatic screen exchanger 22 comprises a stocker unit 26 where the screens 23 are stored, and a lifter unit 27 for lifting and positioning the stocker unit 26 to store a screen 23 in a predetermined stocker unit 26 and to load a desired screen 23 onto the screen printing apparatus 21. A screen transfer unit 28 is provided for transferring the screen 23 between the automatic screen exchanger 22 and the screen printing apparatus 21. A printed circuit board substrate 30 is inserted beneath the screen 23 at the printing position.

FIG. 11 shows a cleaning unit 29 in the screen printing apparatus 21. The cleaning unit 29 is located beneath the screen 23 secured by the screen locking/unlocking device 25 for removing remainings of solder paste from the screen apertures 23a by running forward and backward along the back side of the screen 23.

FIG. 12 is a flowchart for exchanging the screens by the automatic screen exchanger 22 in a prior art arrangement. When the production of print boards using a screen currently selected is completed at Step #101, an NC program is selected for determining a next screen type to be used at Step #102. This is followed by Step #103 where the screen 23 is unlocked at the screen locking/unlocking device 25 for removal. At Step #104, the lifter unit 27 of the automatic screen exchanger 22 is driven upward or downward to position the stocker unit 26 to receive the screen 23. The screen 23 is then transferred and stored in the stocker unit 26 at Step #105. Step #106 follows where the lifter unit 27 is driven upward and downward to position another stocker unit 26 accommodating a desired screen 23 determined by the NC program. The new screen 23 is then transferred from the screen exchanger 22 to the printing apparatus 21 at Step #107 and locked at the locking/unlocking device 25 at Step #108 before restarting the printing operation using the next screen type at Step #109.

In the prior arts, it is necessary to provide such an automatic screen exchanger 22 as described above in addition to the screen printing apparatus 21 for exchanging the screens automatically, which can cause high cost and can require a considerable area for installation. Also, extra space is needed for storage of the screens 23.

The screen apertures 23a shown in FIG. 10 can become prone to be fouled and clogged with the remainings of excess solder paste if the number of printings exceed a certain limit, thereby degrading the quality of the prints, and making it necessary to clean the screen apertures 23a by a cleaning mechanism shown in FIG. 11. When the screen 23 is further used for an additional number of printings or when it has passed a certain duration of time, the screen 23 itself has to be cleaned or replaced with a new one. This can create an extra amount of loss time in the production process.

Thus, the prior art is still seeking a solution to the problem associated with increasing a rate of production and to lower labor costs.

SUMMARY OF THE INVENTION

In view of the foregoing aspects, the present invention provides a screen printing method and apparatus in which screens can be efficiently exchanged in an automatic manner to increase production speed while permitting the production of relatively dense printed circuit patterns.

A screen printing method according to the present invention employs a belt-like screen having a row of printing patterns thereon, compatible with a printed circuit, which are advanced one by one to a predetermined printing position. This allows the screen patterns to be efficiently changed from one to another without the use of a conventional bulky automatic screen exchanging apparatus. Consequently, the space required for storage of the screens will be remarkably reduced and the process can be automated to lower production cost.

A screen printing apparatus according to the present invention includes roller screen holders for holding therebetween a belt-like screen which has a row of printing patterns thereon, and a means for rotating the roller screen holders. This allows the printing patterns to be advanced one by one to a predetermined printing position by the rotating action of the roller screen holders for carrying out the screen printing method of the present invention.

Preferably, a locking/unlocking mechanism may be provided for locking and unlocking the belt-like screen at the printing position without a screen frame, and fastening holes may be provided on the belt-like screen for more correct and secure positioning.

A driver mechanism can rotate the belt-like screen and a controller such as a computer-based control system can automatically activate the driver. The number of printed circuit boards produced with a desired printing pattern can be monitored to determine when a belt-like screen should be rotated to provide a new printing pattern either because of a potential for clogging with solder material or because the desired production run of a predetermined number of printed circuit boards has been achieved.

The mechanism for locking and unlocking the belt-like screen may comprise a set of adjustable locking blocks which can be separately slid to tension or loosen the part of the belt-like screen where a desired printing pattern is located at the printing position. Alternatively, the locking/unlocking mechanism may comprise a plurality of movable pins which can be separately slid to adjust the tension of the part of a desired printing pattern at the printing position.

The belt-like screen may have two rows of sprocket holes at equal intervals of a pitch provided on either edge thereof, so that it can be transferred smoothly and precisely. Such sprocket holes may also be used to apply a tension force uniformly to the belt-like screen while being rewound, or may be partly used as the fastening holes.

The belt-like screen may carry a row of identical printing patterns or a row of different printing patterns. When the number of printing patterns exceeds a predetermined limit or even if a certain amount of time has passed, the current printing pattern can readily be replaced by a new one by providing a row of identical printing patterns on the belt-like screen thereby preventing any clogging problems with a solder paste. The time loss for cleaning and exchanging the screens will thus be eliminated. Also, the time loss for switching to a different kind of screen will be eliminated by providing a row of different printing patterns on the belt-like screen.

The belt-like screen may be made of a metallic mesh, a resin film, or a chemical fiber coated with an emulsion rather than a metal strip. By employing one of these materials, a bending stress of the screen will be decreased, thus allowing the roller screen holders to be minimized in diameter. Also, the entire scale of the screen exchanging unit can be reduced owing to a smaller momental force of a rotating mechanism.

BRIEF DESCRIPTION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein:

FIG. 12 is a flowchart of a process for screen exchange in the conventional screen printing apparatus.

DETAILED DESCRIPTION OF THE PREFERRED EMBODIMENTS

First Embodiment

A screen printing apparatus according to a first embodiment of the present invention will be described by referring to FIGS. 1–3.

Figure 1:
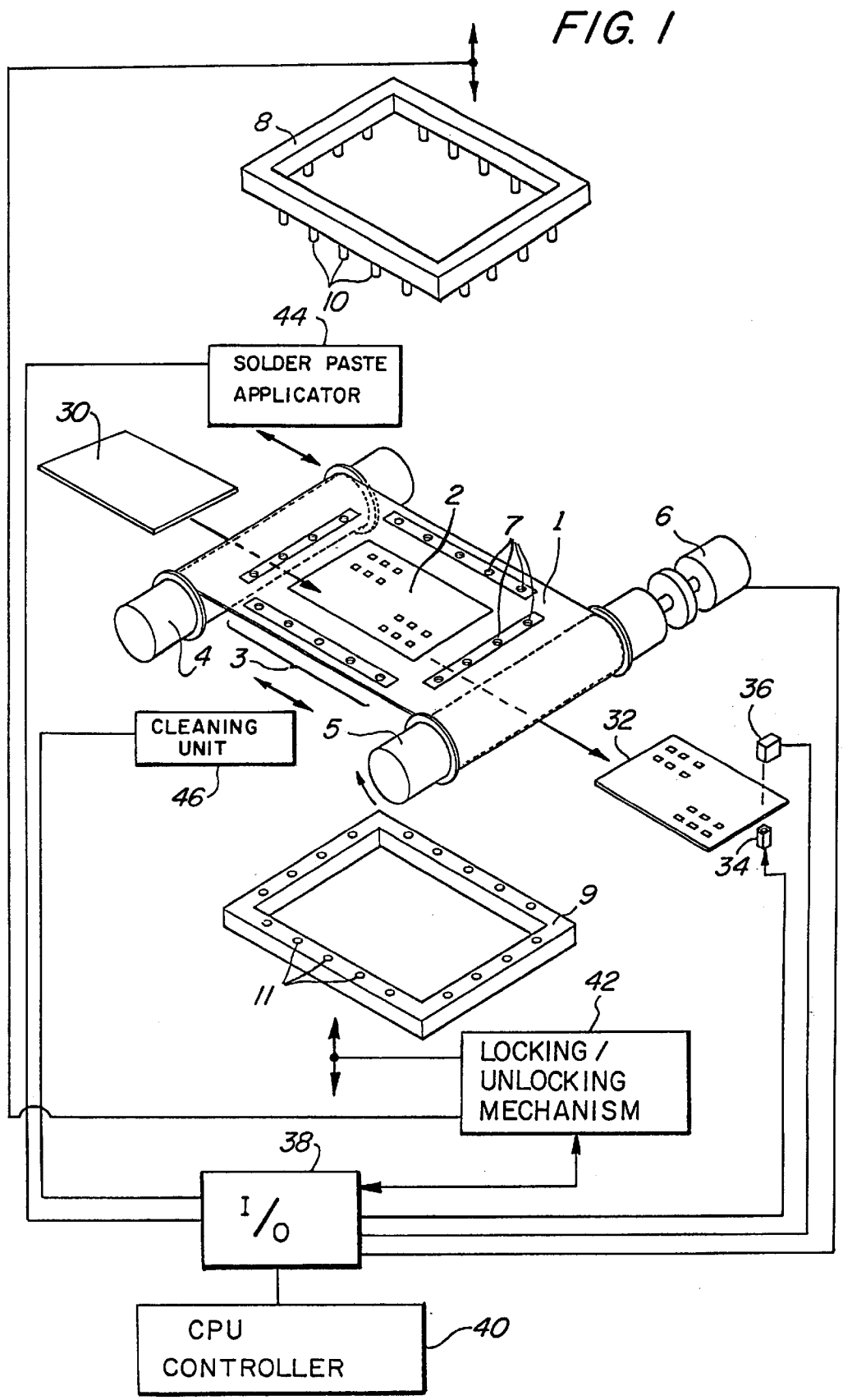
FIG. 1 is a perspective view showing a schematic arrangement of a printing pattern exchanging unit in a screen printing apparatus according to a first embodiment of the present invention.

As shown in FIG. 1, a belt-like screen or elongate flexible cue 1 has printing patterns 2 longitudinally arranged thereon at regular intervals. Two roller screen holders 4 and 5 are disposed at both sides of a print unit 3. The composition of the belt-like screen 1 is not limited to a usual planar metallic screen employing a stainless steel (SUS) strip having substantially a thickness of 0.15 mm or a nickel strip having substantially a thickness of 0.10 mm, and may be any of a metallic mesh sheet having a thickness of 0.07 mm, a resin film, or a screen made of an emulsion coated chemical fiber.

The belt-like screen 1 of a metallic mesh, a resin film, or a chemical fiber has a lower bending stress than those made of a metallic strip such as SUS or a nickel strip, hence allowing the screen holders 4 and 5 to be minimized in the diameter. Also, the size of the screen exchange mechanism can be reduced owing to a small momemtum force of a rotating mechanism.

A reel-out means 6 such as an electric motor is provided for selective driving to rotate the roller screen holder 5 to advance the printing patterns 2 in sequence to the printing unit 3 which defines a printing position. The belt-like screen 1 has a number of fastening or locking holes 7 provided on all sides surrounding each printing pattern 2. An upper and lower locking frames 8, 9 are disposed on the upper and lower sides of the printing unit 3, respectively, for locking and unlocking the printing pattern 2 on the belt-like screen 1 at the printing unit 3. The upper locking frame 8 has locking pins 10 extending downwardly from the lower side thereof, while the lower locking frame 9 has locking holes 11 to receive the locking pins 10 through the fastening holes 7 of the beltlike screen 1. Since the belt-like screen 1 is securely held at the printing unit 3 between the upper and the lower locking frames 8, 9, its vertical deflection caused by a pressing force of a squeegee (not shown) for applying a cream solder paste is eased and the pattern 2 of the belt-like screen 1 at the printing unit 3 will be tensioned equally in all directions. As can be seen in FIG. 1, the fastening holes 7 can be closely positioned relative to the printing pattern to closely frame the printing pattern with the appropriate tension.

A printed circuit board substrate 30 can be automatically loaded at the printing unit 3 beneath the selected printing pattern 2 on the belt-like screen 1 as known in the art. A predetermined amount of a solder paste is dispensed onto the printing pattern 2, by a solder paste applicator 44 as known in the art, and a squeegee (not shown) will spread the solder paste to print the pattern on the substrate 30. The printed pattern substrate 32 is removed from the printing position and during its transportation can interrupt a light beam from a light source such as a photo diode 34 which is aimed at a photo-sensor 36 to provide a count or signal representative of one printing cycle of the printing pattern. The signal is provided through an input/output interface 38 to a CPU based controller 40. The controller 40 can monitor the number of printing cycles or printed substrates 32 and can automatically activate a locking/unlocking mechanism 42 to release the belt-like screen or elongated flexible web and can drive the electric motor 6 to provide a new printing pattern at the printing position 3. The locking/unlocking mechanism 42 is then activated to securely hold the new printing pattern with appropriate tension by driving the locking frames 8 and 9 to engage each other. Thus, an automatic operation can be implemented to insure a highly efficient production while removing clogging problems of solder on the printing patterns by a timely exchange of printing patterns after a predetermined cycle of printings. A cleaning unit 46 can extend across the web number 1 to provide a cleaning operation to remove excess solder paste.

Figure 2A:
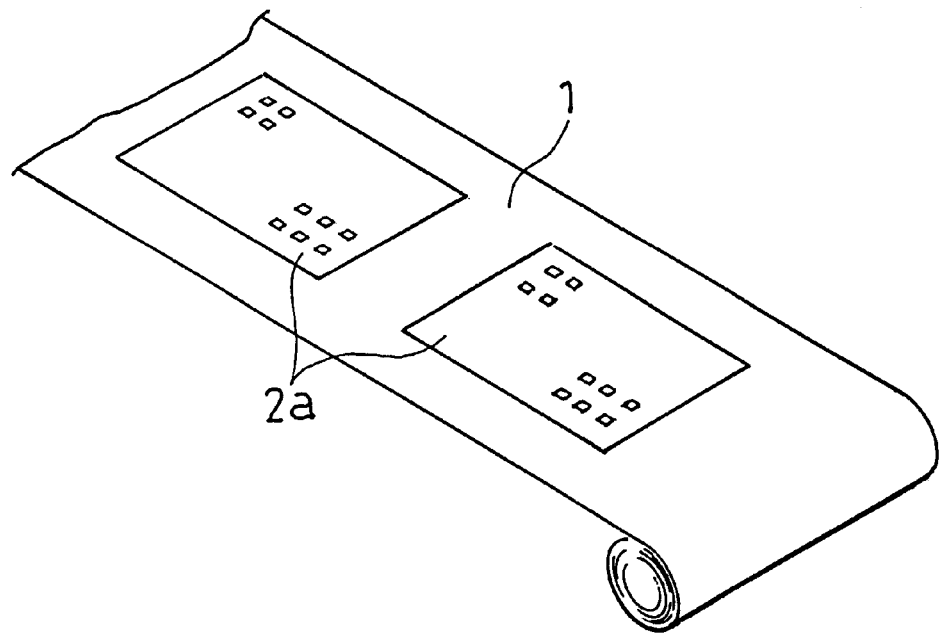
FIG. 2A is a perspective view illustrating an exemplary arrangement of a belt-like screen having a row of identical printing patterns, FIG. 2B illustrating another belt-like screen having a row of different printing patterns.

The belt-like screen 1 may carry identical printing patterns 2a for printing one specific pattern as shown in FIG. 2A, or different printing patterns 2b for printing different patterns, whichever is selectively used depending on the form of production.

Figure 3:
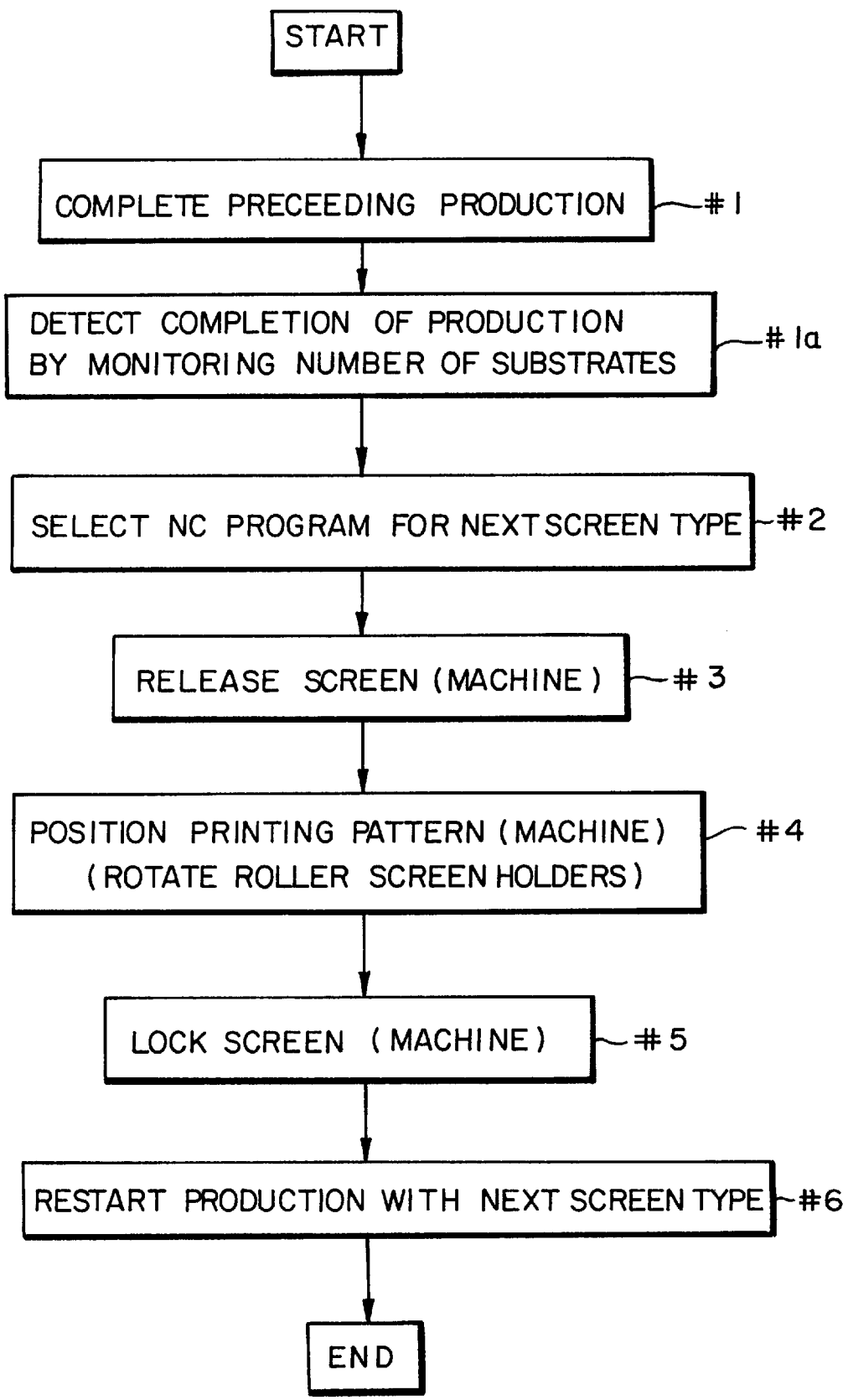
FIG. 3 is a flowchart of a process for automatic screen exchange in the embodiment.

FIG. 3 is a flowchart showing a procedure for screen exchange in the embodiment. When the production of print boards with a printing pattern currently selected is completed at Step #1 and detected at Step #1a, an NC program for printing a next type of pattern is selected at Step #2 to be implemented by the CPU controller 40 to apply solder paste and to automatically print a predetermined number of printed circuit board substrates 32. At Step #3, the belt-like screen 1 is unlocked to release the current printing pattern 2 from the printing unit 3 and to feed a succeeding printing pattern 2 to the printing unit 3. The roller screen holders 4 and 5 are rotated at Step #4 to position the succeeding printing pattern 2 as defined by positions stored in the selected NC program at the printing unit 3. The belt-like screen 1 is locked between the upper and the lower locking frames 8, 9 at Step #5 to position the succeeding printing pattern 2 at the printing unit 3. At Step #6, the printing operation is restarted for production of print boards using the succeeding type of pattern.

Second Embodiment

Figure 4:
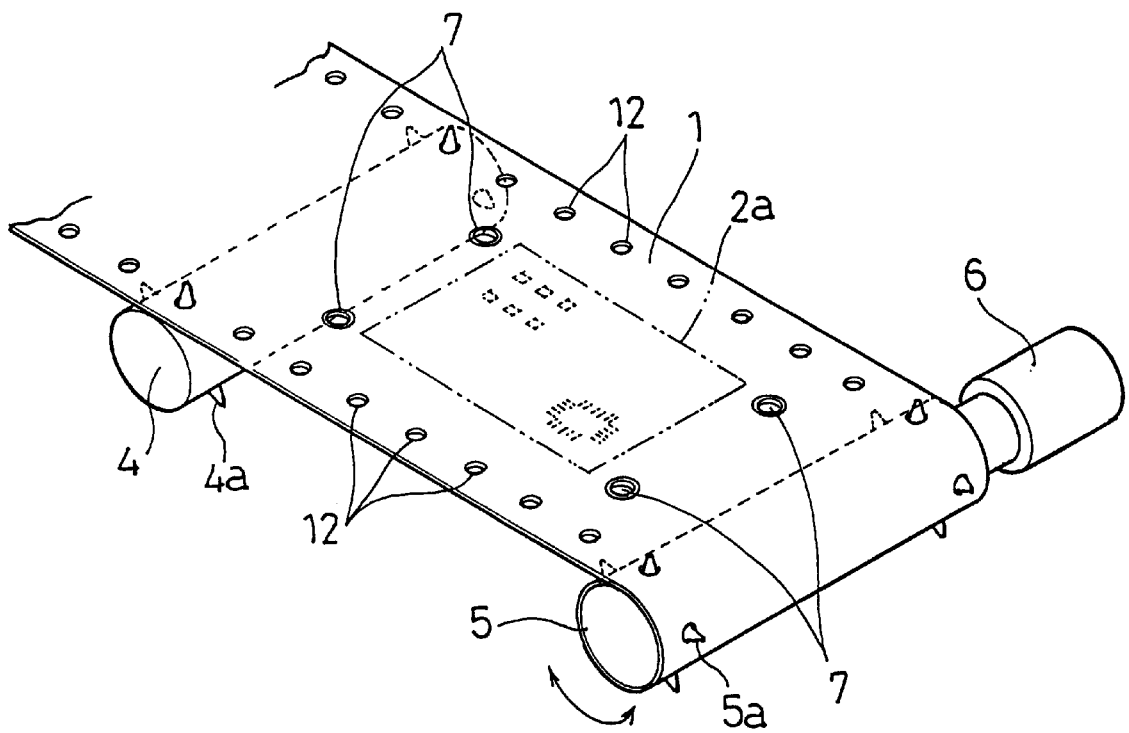
FIG. 4 is a perspective view showing a schematic arrangement of a printing pattern exchanging unit in a screen printing apparatus according to a second embodiment of the present invention.

A second embodiment of the present invention will now be described referring to FIGS. 4 and 5. A belt-like screen 1 of this embodiment has a row of identical printing patterns 2a provided thereon such as shown in FIG. 2A. Further, the belt-like screen has two rows of sprocket holes 12 arranged along both sides thereof at equal intervals. The roller screen holders 4 and 5 are provided with projections 4a and 5a, respectively, for the engagement with the sprocket holes 12 of the belt-like screen 1. The sprocket holes 12 are provided for smooth and precise transfer of the belt-like screen 1, and also for uniformly tensioning the belt-like screen 1 which is being rewound on the roller screen holder 5. The fastening holes 7 on the belt-like screen 1 are provided on both longitudinal ends of each printing pattern 2a, and the sprocket holes 12 on both sides serve as the locking holes along the longitudinal direction of the printing pattern 2a.

Figure 5:
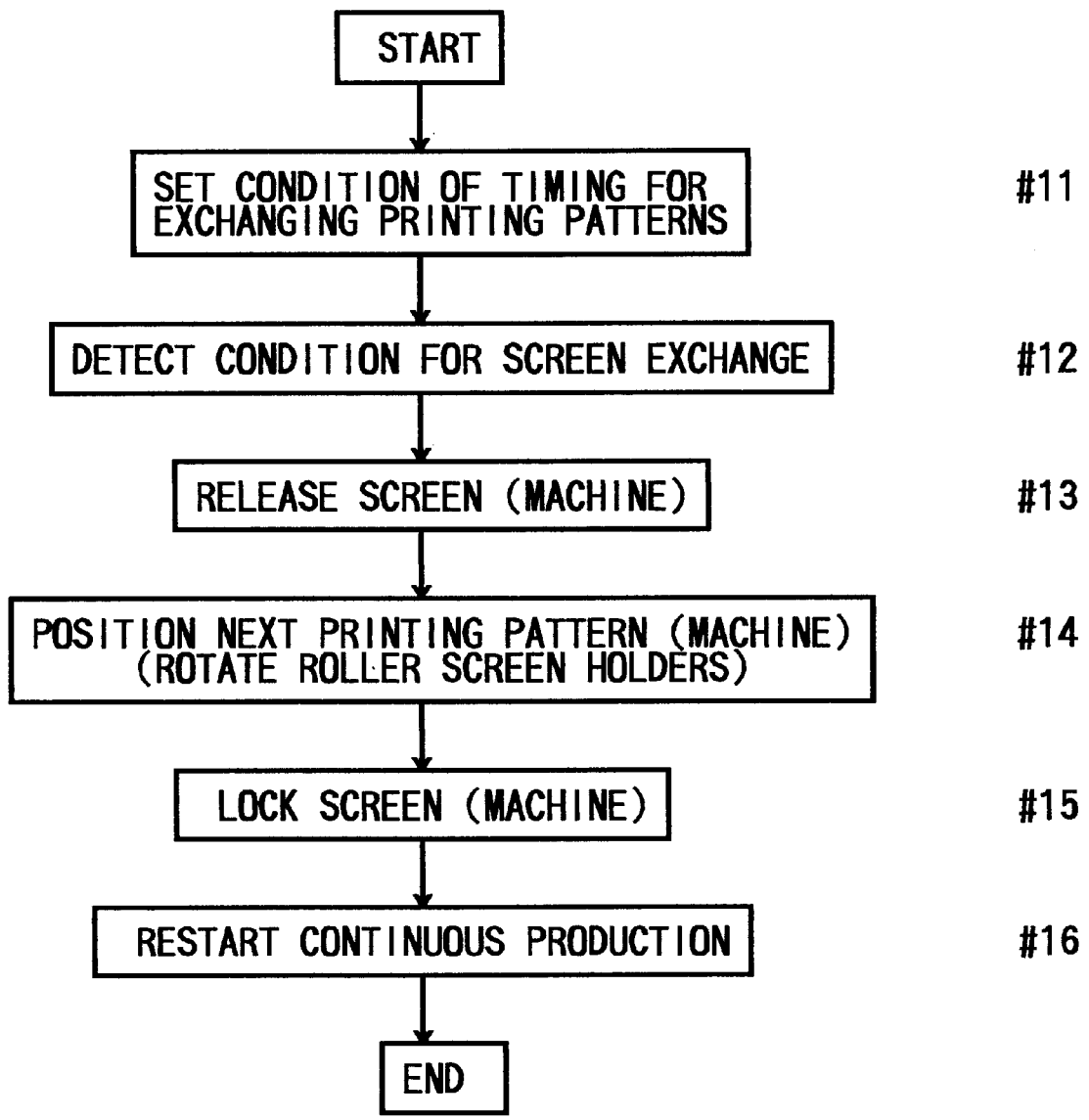
FIG. 5 is a flowchart of a process for screen exchange in the second embodiment.

FIG. 5 is a flowchart showing a procedure for screen exchange in the second embodiment. As shown, conditions of the timing for exchanging screens are first determined at Step #11, which are to be detected at Step #12. The Step #12 is equivalent to a procedure in the prior art where it is detected whether the number of printing has exceeded a certain limit and cleaning or replacing the current screen is required. When it is detected that exchange of the screens is required, a new printing pattern 2 is advanced and positioned at Steps #13 to #15 before Step #16 where the printing operation is further continued.

This procedure of exchanging the printing patterns 2 is carried out while a printed circuit board on which a pattern is printed is being transferred, hence minimizing the time loss which causes a decrease in the productivity. Accordingly, the printing screens can be efficiently exchanged and the quality of resultant prints will be ensured.

Detection of the timing for starting screen exchange at Steps #11 and #12 may depend on clogging in the screen apertures, visual quality of prints examined by a known scanning device, or any other examination results.

Third Embodiment

Figure 2B:
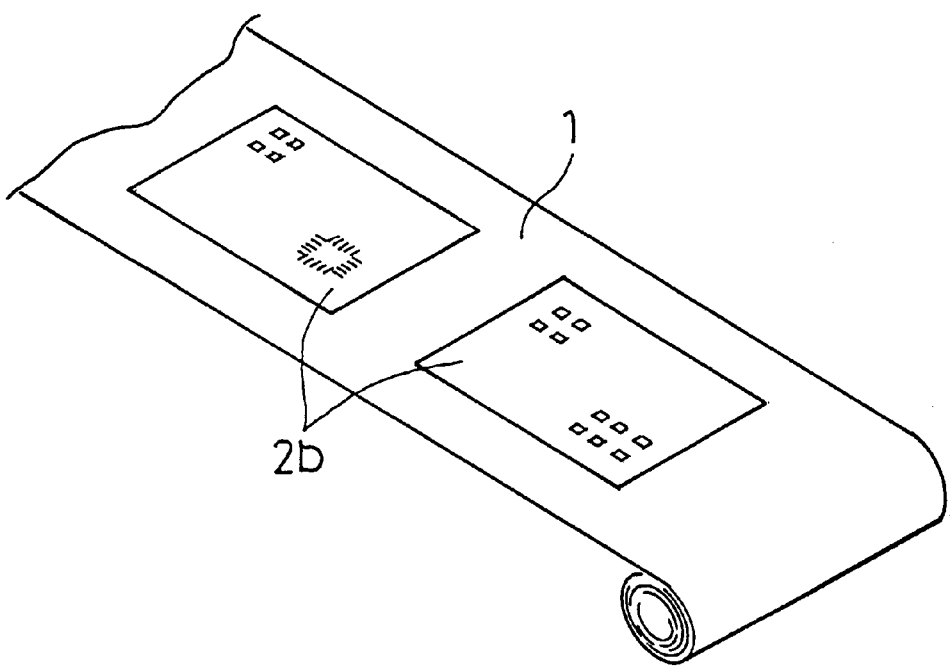
Figure 6:
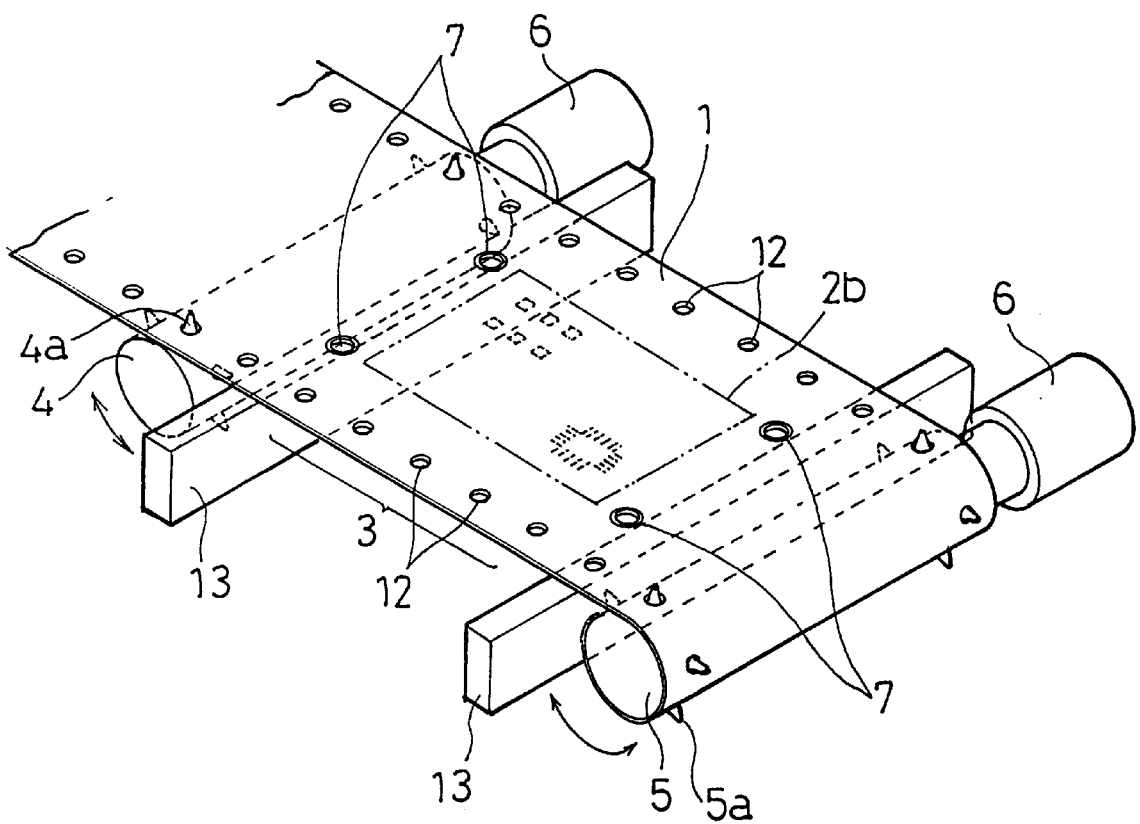
FIG. 6 is a perspective view showing a schematic arrangement of a printing pattern exchanging unit in a screen printing apparatus according to a third embodiment of the present invention.

A third embodiment of the present invention will be described referring to FIG. 6. A belt-like screen 1 of this embodiment has a row of different printing patterns 2b for printing different patterns such as shown in FIG. 2B. As shown in FIG. 6, the belt-like screen 1 is transferred reversibly forward and backward by the roller screen holders 4 and 5 driven by their respective reel-out means 6. A couple of cleaning units 13 are disposed at both ends of the printing unit 3, so that a printing pattern 2b once used is re-selected and re-used. This allows for a flexible/production of multi-type print boards in small quantity randomly supplied to be processed.

The process for the screen exchange of the third embodiment is similar to that of the first embodiment shown in the flowchart of FIG. 3. When the current production of print boards using one printing pattern 2b is finished at Step #1, a new printing pattern 2b is selected at Step #2 and positioned at Step #4 before restarting the printing operation at Step #6. The screen exchange is carried out while a printed circuit board on which the pattern is printed is being transferred, hence minimizing the time loss which causes a decrease in the productivity. The procedure shown in FIG. 5 may also be implemented in this embodiment, in which case the need for switching to a next type of printing pattern is detected at Steps #11 and #12 for automatic printing pattern changeover.

Fourth Embodiment

Figure 7:
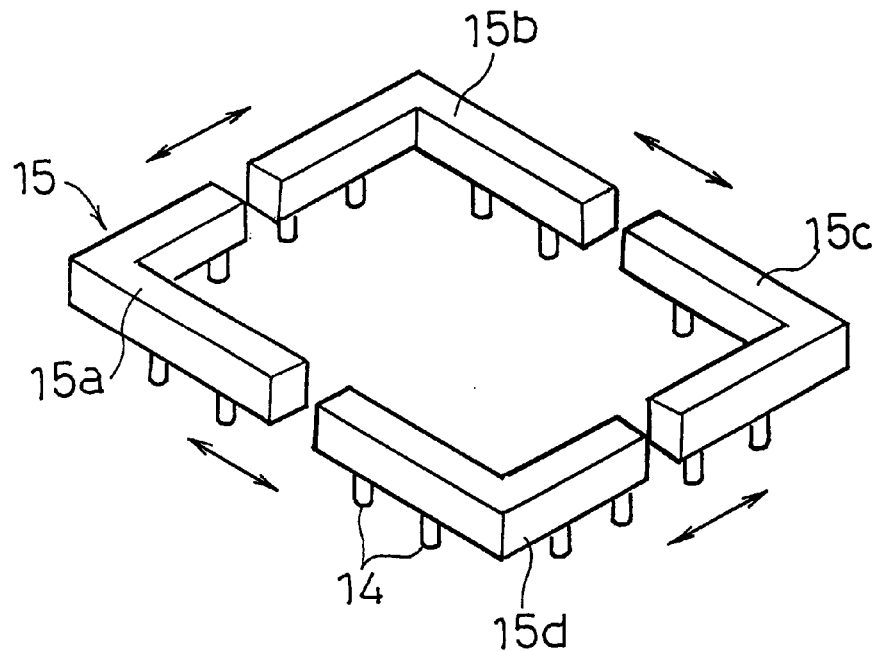
FIG. 7 is a perspective view of a locking/unlocking device according to a fourth embodiment of the present invention.

A fourth embodiment of the present invention will be described referring to FIGS. 7 and 8. Unlike the other embodiments previously described, wherein the belt-like screen 1 is locked and unlocked between the upper and the lower locking frames 8, 9, this embodiment employs an adjustable locking frame 15 provided above the printing unit 3 which comprises a set of L-shaped blocks 15a to 15d, each block having locking pins 14 extending from the lower side thereof as shown in FIG. 7. The L-shaped blocks 15a to 15d are arranged for sliding movements to and from each other. The locking pins 14 are inserted into the fastening holes 7 of the belt-like screen 1 from above and engaged therewith at the printing unit 3. The belt-like screen 1 can be locked and uniformly tensioned by the blocks 15a to 15d.

Figure 8:
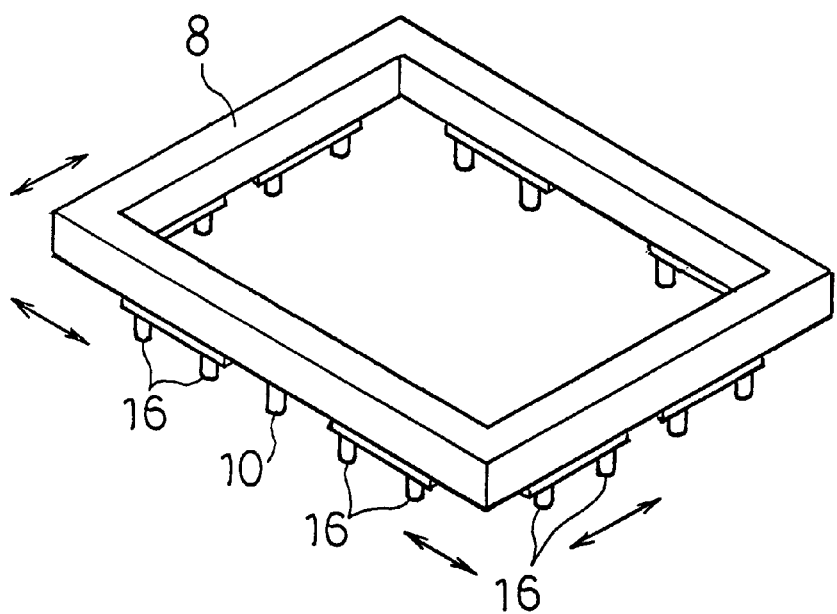
FIG. 8 is a perspective view showing a modification of the locking/unlocking device according to the fourth embodiment.
Figure 9:
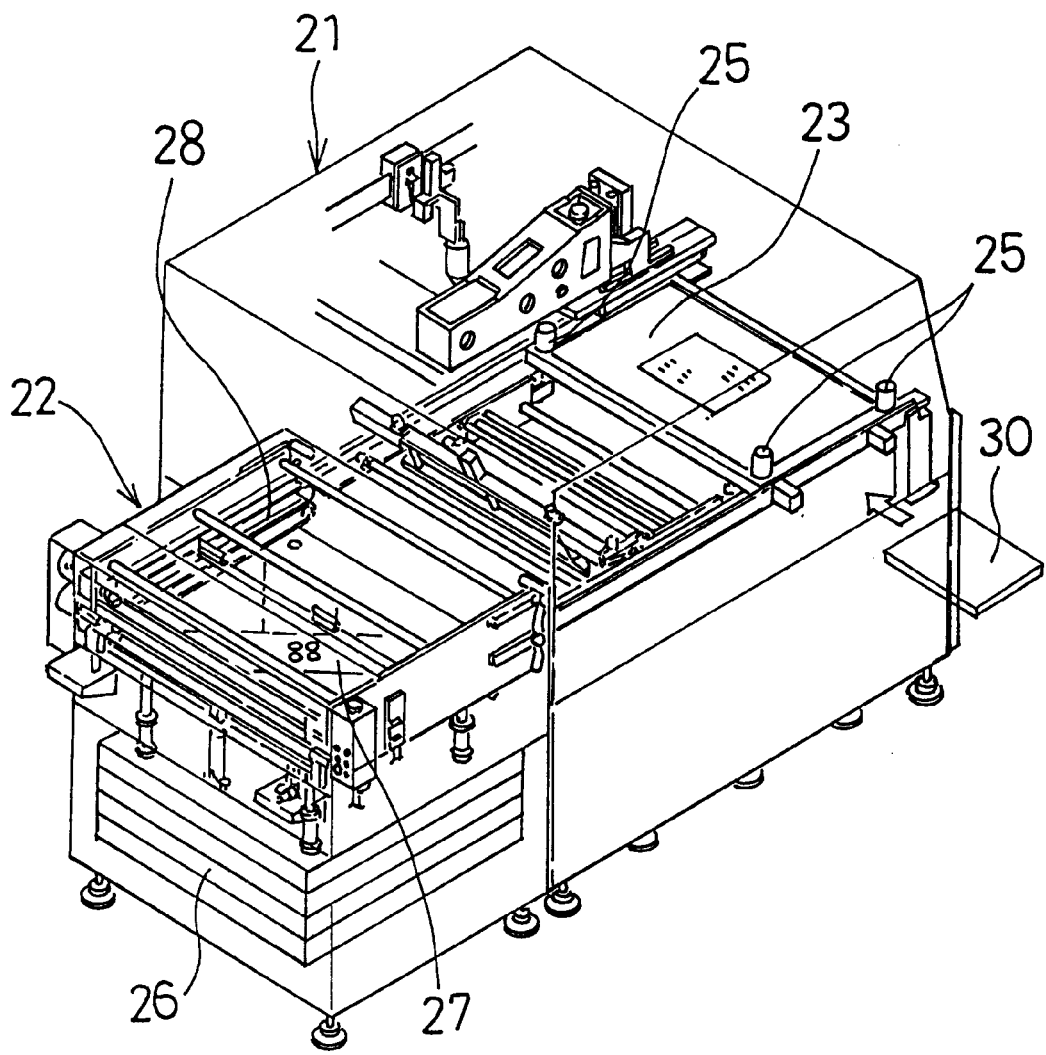
FIG. 9 is a perspective view showing an arrangement of a conventional screen printing apparatus.
Figure 10:
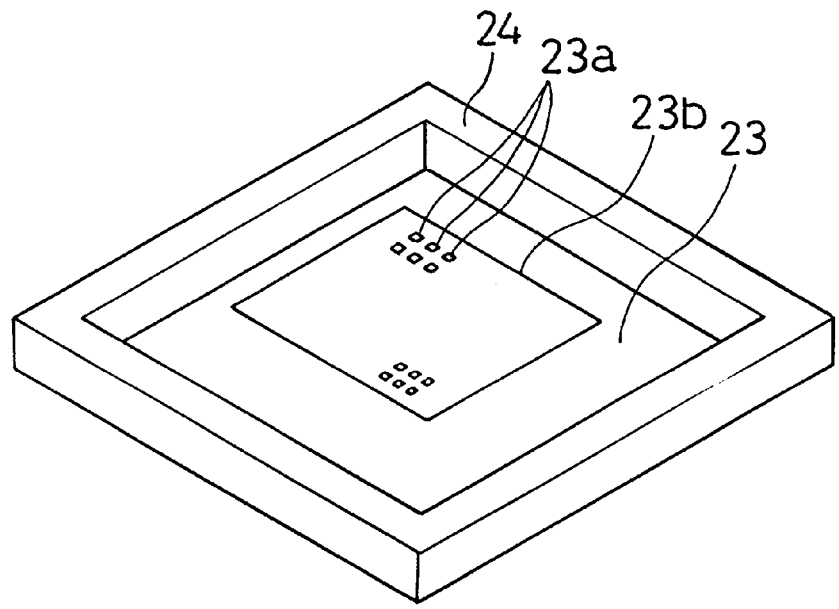
FIG. 10 is a perspective view of a screen in the conventional screen printing apparatus.
Figure 11:
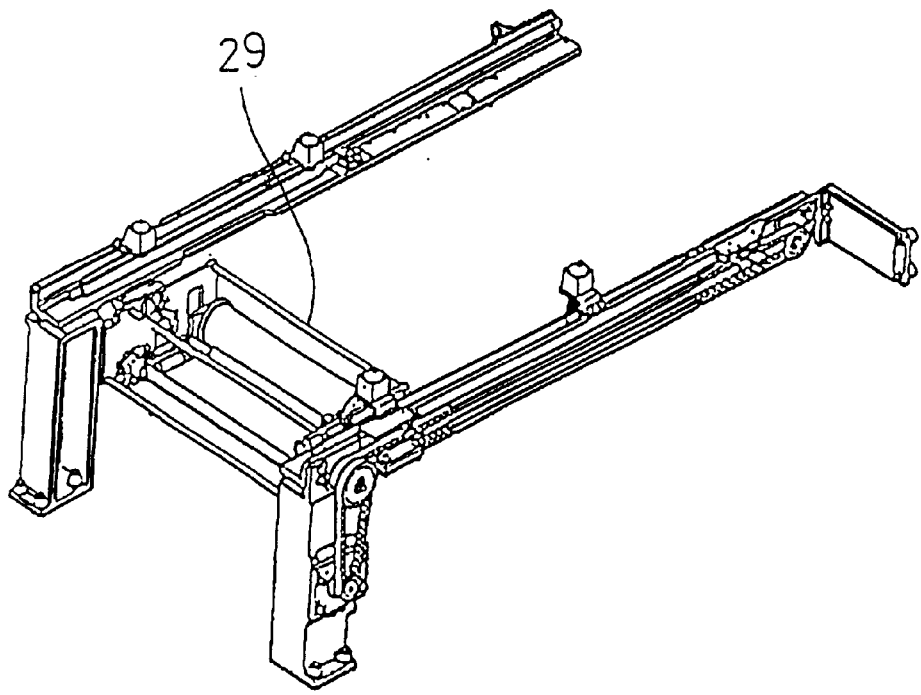
FIG. 11 is a perspective view of a cleaning mechanism in the conventional screen printing apparatus.

This arrangement may be substituted by movable pins 16 mounted on the upper locking frame 8 as shown in FIG. 8.

It is understood that the belt-like screen 1 having a row of the printing patterns 2 may be conveyed to the outside of the screen printing apparatus instead of wound around the roller screen holders 4 and 5.

As set forth above, the screen printing method of the present invention employs a belt-like screen which has a row of printing patterns provided thereon and is driven by the rotating action of roller screen holders so that the printing patterns are advanced one by one to a printing unit. This allows the screen patterns to be efficiently changed from one to another without the use of a conventional automatic screen exchanging apparatus of a large scale. Consequently, the space for the automatic screen exchanging apparatus and for storage of screens can be cut down.

According to each of the prescribed embodiments, the screen exchange is readily carried out in the screen printing apparatus, contributing to downsized space for installation, decreasing the time loss for exchanging or cleaning the screens, and facilitating the printing pattern changeover.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. A screen printing apparatus for providing conductive patterns on a printed circuit board comprising:
    a belt-like screen having a plurality of printing patterns formed thereon, for forming a printed circuit, and having a series of fastening holes in a widthwise direction of the belt-like screen adjacent each printing pattern;
    means for feeding the belt-like screen in a lengthwise direction;
    means for fixing the belt-like screen in place with said fastening holes at a predetermined printing position;
    means for detecting whether a printing pattern that is located at the printing position has reached a predetermined cycle of printings; and
    controlling means for controlling automatic feeding of the belt-like screen in the lengthwise direction such that the printing pattern is replaced with the next printing pattern upon detection of the predetermined cycle of printings.

2. A screen printing apparatus according to claim 1, wherein the means for fixing the belt-like screen includes an upper locking frame with locking pins and a lower locking frame with corresponding locking holes for receiving the locking pins.

3. A screen printing apparatus according to claim 1, wherein the feeding of a printing pattern in the lengthwise direction toward the printing position is effected simultaneously with an operation of unloading a circuit board substrate on which a predetermined pattern has been printed and an operation of loading a new circuit board substrate toward the printing position.

4. A screen printing apparatus according to claim 1, wherein the means for detecting whether the printing pattern has reached the predetermined cycle of printings is a means for counting the number of circuit board substrates that have been brought to the printing position.

5. A screen printing apparatus according to claim 1, wherein the plurality of printing patterns includes discrete printing patterns which are all identical formed in the belt-like screen.

6. A screen printing apparatus according to claim 1, wherein the plurality of printing patterns includes discrete printing patterns of different types formed in the belt-like screen, and when printing with a printing pattern is completed, a next printing pattern of a different type is positioned at the printing position.

7. A screen printing apparatus according to claim 1, wherein the means for fixing the belt-like screen in place at the predetermined printing position includes a locking/unlocking mechanism.

8. A screen printing apparatus according to claim 7, wherein the locking/unlocking mechanism comprises an upper locking frame of which a planar size is adjustable in accordance with the size of the printing pattern, and which has locking pins, and a lower locking frame having corresponding locking holes for receiving the locking pins.

9. A screen printing apparatus according to claim 7, wherein the locking/unlocking mechanism comprises an upper locking frame having locking pins, whose position is adjustable in accordance with the size of printing pattern, and a lower locking frame having corresponding locking holes for receiving the locking pins.

10. A screen printing apparatus according to claim 1, wherein the means for feeding the belt-like screen in the lengthwise direction comprises roller screen holders for holding and winding the belt-like screen, and a driver for rotating the roller screen holders.

11. A screen printing apparatus according to claim 10, wherein the roller screen holders comprise at least one roller, and the means for feeding the belt-like screen in the lengthwise direction further comprises sprocket projections provided on the roller and rows of sprocket holes aligned on either edge of the belt-like screen at equal intervals for receiving the sprocket projections.

12. A screen printing apparatus for providing conductive patterns on a printed circuit board comprising:
    a belt-like screen having a plurality of printing patterns;
    means for feeding the belt-like screen in a lengthwise direction, said means for feeding the belt-like screen moves the belt-like screen in either a forward direction and a backward direction; and
    means for fixing the belt-like screen in place at a predetermined printing position, wherein the belt-like screen is fed in either the forward or the backward direction depending on the direction in which a next printing pattern to be utilized is located nearer to the printing position.

13. A screen printing apparatus according to claim 12, wherein the printing patterns formed in the belt-like screen are respectively compatible with different types of printed circuits, and when the type of printed circuit board to be produced is switched from one to another, a controller determines whether to feed the belt-like screen in the forward direction or in the backward direction for positioning a corresponding printing pattern, for producing printed circuit boards, to be utilized next at the printing position.

14. A screen printing apparatus according to claim 12, wherein the means for feeding the belt-like screen in the lengthwise direction comprises a pair of roller screen holders for holding and winding the belt-like screen disposed at each end of a printing position in the lengthwise direction of the belt-like screen and a drive means for rotating either one of the roller screen holders in a direction of winding up the belt-like screen.

15. A screen printing apparatus according to claim 14, wherein cleaning units are provided at each end of the printing position in the lengthwise direction.

16. A screen printing apparatus according to claim 12, wherein the means for feeding the belt-like screen in the lengthwise direction comprises at least one roller having sprocket projections provided on the roller and rows of sprocket holes provided on either edge of the belt-like screen at equal intervals.

17. A screen printing apparatus according to claim 12, wherein switching of a printing pattern with another printing pattern is effected simultaneously with an operation of unloading a circuit board substrate on which a predetermined pattern has been printed and an operation of loading a new circuit board substrate toward the printing position.

18. A screen printing apparatus for providing conductive patterns on a printed circuit board comprising:

a belt-like screen having a plurality of printing patterns, compatible with a printed circuit, formed thereon;

means for feeding the belt-like screen in a lengthwise direction;

means for fixing the belt-like screen in place at a predetermined printing position, wherein the means for fixing the belt-like screen comprises an upper locking frame having locking pins whose position is adjustable in accordance with a size of the printing pattern, and a lower frame having corresponding locking holes for receiving the locking pins.

19. In a screen printing apparatus for providing conductive patterns on a printed circuit board, the improvement comprising:

an elongated flexible web member having a plurality of discrete printing patterns spaced sequentially along the web member;

means for moving the flexible web member so that a discrete printing pattern is positioned at a printing position, including at least one roller for wrapping a portion of the flexible web member about a circumference of the roller; and means for locking and uniformly tensioning the discrete printing pattern at the printing position includes an adjustable locking frame having an upper frame and a lower frame with which a circumference of one of the printing patterns is fixedly held from both upper and lower sides of the printing pattern, and the flexible web member includes a first series of sprocket holes for engaging the roller and a second series of locking holes adjacent each discrete printing pattern for engaging the adjustable locking frame.

* * * * *